United States Patent
Chien et al.

(10) Patent No.: US 7,339,225 B2
(45) Date of Patent: Mar. 4, 2008

(54) CAPACITOR STRUCTURE

(75) Inventors: Chih-Fu Chien, Taipei (TW);
Chao-Chi Lee, Taipei (TW);
Cheng-Chung Chou, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/908,639

(22) Filed: May 20, 2005

(65) Prior Publication Data

US 2006/0261394 A1 Nov. 23, 2006

(51) Int. Cl.
*H01L 27/108* (2006.01)
*H01L 29/76* (2006.01)
*H01L 29/94* (2006.01)
*H01L 31/119* (2006.01)

(52) U.S. Cl. .............. 257/303; 257/532; 257/E27.034; 257/E27.048

(58) Field of Classification Search ................ 257/303, 257/306, 307, 308, 309, 532, 906, 296, 300, 257/774, 758, 211, E27.034, E27.048, E23.175, 257/E23.145, E23.151, E23.168, E21.59
See application file for complete search history.

(56) References Cited

U.S. PATENT DOCUMENTS 5,583,359 A * 12/1996 Ng et al. ................... 257/306

\* cited by examiner

*Primary Examiner*—Hoai v Pham
*Assistant Examiner*—DiLinh Nguyen
(74) *Attorney, Agent, or Firm*—Winston Hsu

(57) ABSTRACT

A capacitor structure is provided. The capacitor structure is configured in a substrate. The capacitor structure includes a plurality of electrode sets, at least a first conductive plug and at least a second conductive plug. The electrode sets correspond with each other and are disposed in different layers of the substrate. Each electrode set comprises a first electrode and a second electrode surrounding the former. In addition, the first conductive plug and the second conductive plug are disposed between two adjacent electrode sets. First electrodes of two adjacent electrode sets correspond with each other and are electrically connected to each other through the first conductive plug. Similarly, second electrodes of two adjacent electrode sets correspond with each other and are electrically connected to each other through the second conductive plug.

5 Claims, 4 Drawing Sheets

CAPACITOR STRUCTURE

BACKGROUND OF THE INVENTION

1. Field of the Invention

The present invention relates to a capacitor structure. More particularly, the present invention relates to a capacitor structure having a three-dimensional electrode.

2. Description of the Related Art

Capacitor is one of the indispensable elements in an integrated circuit. In the design and fabrication of a capacitor, the capacitance and setup area of the capacitor is an important consideration. Thus, better capacitor design and fabrication method is always sought after.

For example, the memory unit (or memory cell) of a dynamic random access memory (DRAM) generally includes a transistor and a capacitor serving as a storage device for saving bit-sized data. By selectively charging or discharging each capacitor in an array of capacitors on a semiconductor substrate, vast data can be stored. For a memory capacitor having a fixed operating voltage, the capacitance of the capacitor mainly depends on the surface area of the capacitor electrode when the pitch between the electrodes and the dielectric constant of the dielectric material are fixed.

FIG. 1 is a perspective view showing the structure of a conventional parallel plate capacitor. As shown in FIG. 1, the parallel-plate capacitor structure 100 mainly comprises a top electrode plate 110, a bottom electrode plate 120 and a dielectric layer 130 disposed between the top electrode plate 110 and the bottom electrode plate 120. The top electrode plate 110 and the bottom electrode plate 120 are parallel to each other and are separated from each other by a distance d. Conventionally, this type of parallel-plate capacitor structure 100 utilizes the parallel electric field generated between the top electrode plate 110 and the bottom electrode plate 120 to obtain the desired capacitance value, i.e. parallel plate capacitance. Hence, the capacitance of the parallel-plate capacitor structure 100 is directly proportional to the surface area of the top electrode plate 110 and the bottom electrode plate 120.

With the rapid progress in semiconductor manufacturing technology, integrated circuits are increasingly miniaturized and integrated. Because the conventional parallel-plate capacitor structure demands considerable area, it no longer meets the design requirement for a high level of circuit integration. In other words, taking the aforementioned DRAM as an example, if the conventional parallel-plate capacitor structure is adopted, the minimized memory cell cannot accommodate the top and the bottom electrode plates. Consequently, the capacitance value of the capacitor is relatively reduced. As the capacitance of the capacitor is reduced, the probability of having data storage error is significantly increased.

Hence, a capacitor structure with higher capacitance and a high degree of integration is highly desired, which can increase the surface area of the electrode plates while the area occupied by the storage capacitor is reduced.

SUMMARY OF THE INVENTION

Accordingly, at least one objective of the present invention is to provide a capacitor structure with high performance, which is capable of providing a larger capacitance within a relatively small layout space.

At least another objective of the present invention is to provide a capacitor structure for improving the spatial utilization of a substrate so that the circuit design can be more flexible.

To achieve these and other advantages and in accordance with the purpose of the invention, as embodied and broadly described herein, the invention provides a capacitor structure. The capacitor structure is configured on a substrate. The capacitor structure comprises a plurality of electrode sets, at least a first conductive plug and at least a second conductive plug. The electrode sets correspond with each other and are disposed in different layers of the substrate. Each electrode set comprises a first electrode and a second electrode surrounding the first. In addition, the first conductive plug and the second conductive plug are disposed between two adjacent electrode sets. The first electrodes of two adjacent electrode sets correspond with each other and are electrically connected to each other through the first conductive plug. Similarly, the second electrodes of two adjacent electrode sets correspond with each other and are electrically connected to each other through the second conductive plug.

In one embodiment of the present invention, each first electrode takes a block or ring shape and each second electrode takes a ring shape, for example.

In one embodiment of the present invention, each electrode set further comprises a third electrode disposed around the second electrode. Furthermore, the third electrode takes a ring shape, for example.

In one embodiment of the present invention, the substrate further comprises at least a dielectric layer disposed between two adjacent electrode sets such that the first conductive plug and the second conductive plug are located within the dielectric layer.

The present invention also provides another capacitor structure configured in a substrate. The capacitor structure comprises a plurality of electrode sets, a plurality of first conductive plugs and a plurality of second conductive plugs. The electrode sets correspond with each other and are disposed in different layers of the substrate. Each electrode set comprises a plurality of first electrodes and a plurality of second electrodes. Furthermore, the first electrodes and the second electrodes are alternately disposed to form an array. In addition, the first conductive plug and the second conductive plug are disposed between two adjacent electrode sets. The first electrodes of two adjacent electrode sets correspond with each other and are electrically connected to each other through the first conductive plug. Similarly, the second electrodes of two adjacent electrode sets correspond with each other and are electrically connected to each other through the second conductive plug.

In one embodiment of the present invention, each first electrode and second electrode takes a block shape, for example.

In one embodiment of the present invention, the substrate further comprises at least a dielectric layer disposed between two adjacent electrode sets such that the first conductive plug and the second conductive plug are located within the dielectric layer.

In one embodiment of the present invention, the substrate further comprises a first power source layer and a second power source layer. The first electrode is coupled to the first power source layer and the second electrode is coupled to the second power source layer.

Accordingly, the present invention provides a vertical capacitor structure configured within a multi-layered substrate so that an electric field is created in the electrodes in three dimensions, so as to obtain the desired capacitance value. Therefore, through the capacitor structure of the present invention, the required capacitance can be produced within a relatively small space. In other words, some space on the substrate can be saved to make the circuit design more flexible.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
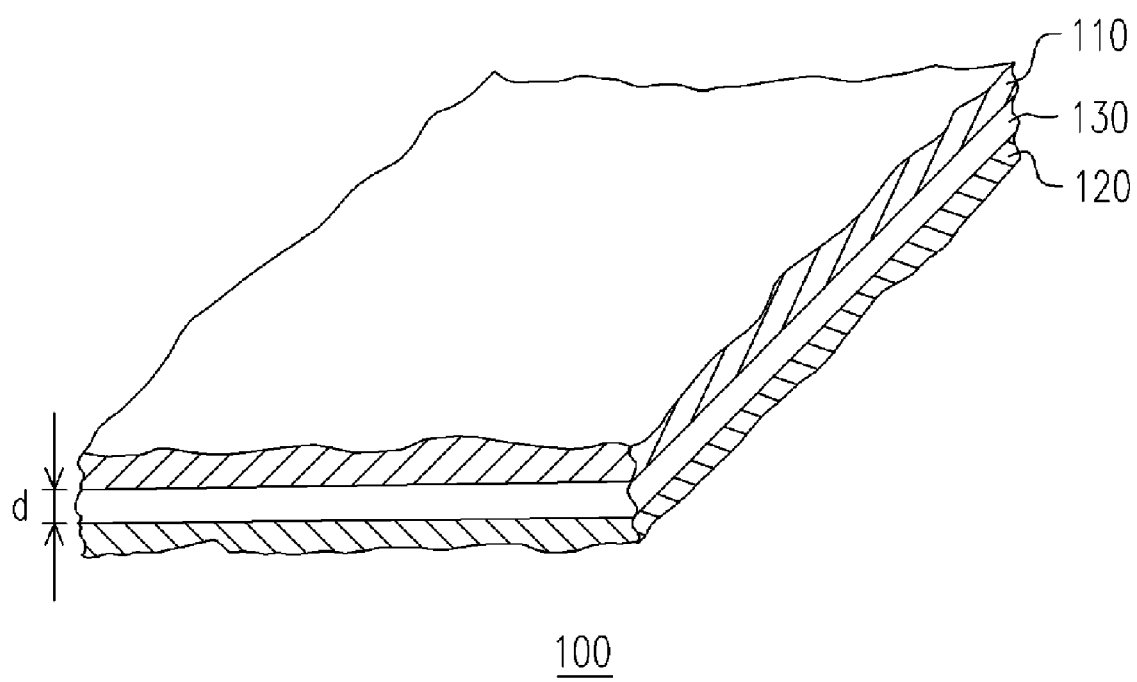
FIG. 1 is a schematic view showing the structure of a conventional parallel plate capacitor.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 2:
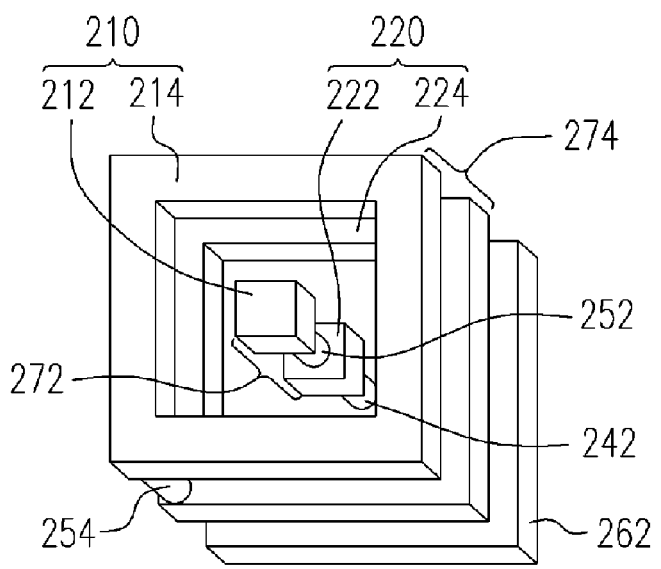
FIG. 2 is a three-dimensional view of a capacitor structure according to a first embodiment of the present invention.

FIG. 2 is a three-dimensional view of a capacitor structure according to a first embodiment of the present invention. For a clear demonstration of the capacitor structure, only a section of the substrate is shown in FIG. 2. As shown in FIG. 2, the capacitor structure 200 is configured in a substrate (not shown). The substrate is a semiconductor substrate, a circuit board or other types of circuit substrates, for example. The capacitor structure 200 comprises a first electrode set 210, a second electrode set 220, a first conductive plug 252 and a second conductive plug 254. The first electrode set 210 and the second electrode set 220 are located on different layers of the substrate (not shown), corresponding to each other. In one embodiment, the first electrode set 210 and the second electrode set 220 are disposed on the opposite sides of a dielectric layer (not shown) within a substrate, for example.

As shown in FIG. 2, the first electrode set 210 further comprises a first electrode 212 and a second electrode 214 surrounding the first electrode 212. The second electrode set 220 comprises a first electrode 222 and a second electrode 224 surrounding the first electrode 222. The first electrode 212 and the second electrode 214 of the first electrode set 210 are disposed in a corresponding position to the first electrode 222 and the second electrode 224 of the second electrode set 220. The first electrode 212 and the second electrode 214 of the first electrode set 210 are on the same layer within the substrate so that they are fabricated in the same process and hence a more precise pattern alignment can be achieved. Similarly, the first electrode 222 and the second electrode 224 of the second electrode set 220 can be fabricated in the same process to have more precise pattern alignment. In addition, the first conductive plug 252 is disposed in the dielectric layer (not shown) and between the first electrode 212 of the first electrode set 210 and the first electrode 222 of the second electrode set 220. Hence, the first electrode 212 of the first electrode set 210 and the first electrode 222 of the second electrode set 220 are electrically connected through the first conductive plug 252. Similarly, the second conductive plug 254 is disposed in the dielectric layer (not shown) and between the second electrode 214 of the first electrode set 210 and the second electrode 224 of the second electrode set 220. Hence, the second electrode 214 of the first electrode set 210 and the second electrode 224 of the second electrode set 220 are electrically connected through the second conductive plug 254.

In the present embodiment, the first electrodes 212 and 222 take a block shape and are connected through the first conductive plug 252 to form a pillar-shaped first electrode structure 272. The second electrodes 214 and 224 take a ring shape and are connected through the second conductive plug 254 to form a second electrode structure 274 surrounding the first electrode structure 272. The first electrode structure 272 can be coupled with an underlying power source layer 262 through a conductive plug 242. Furthermore, the second electrode structure 274 can be coupled with another power source layer (not shown) lying above or outward from the second electrode structure 274 so that an electric field is created between the first electrode structure 272 and the second electrode structure 274 to provide the required capacitance.

Second Embodiment

Aside from the aforementioned first embodiment with a block-shaped first electrodes 212 and 222 and ring-shaped second electrodes 214 and 224, the electrodes in the capacitor structure of the present invention can have other shapes and designs.

Figure 3:
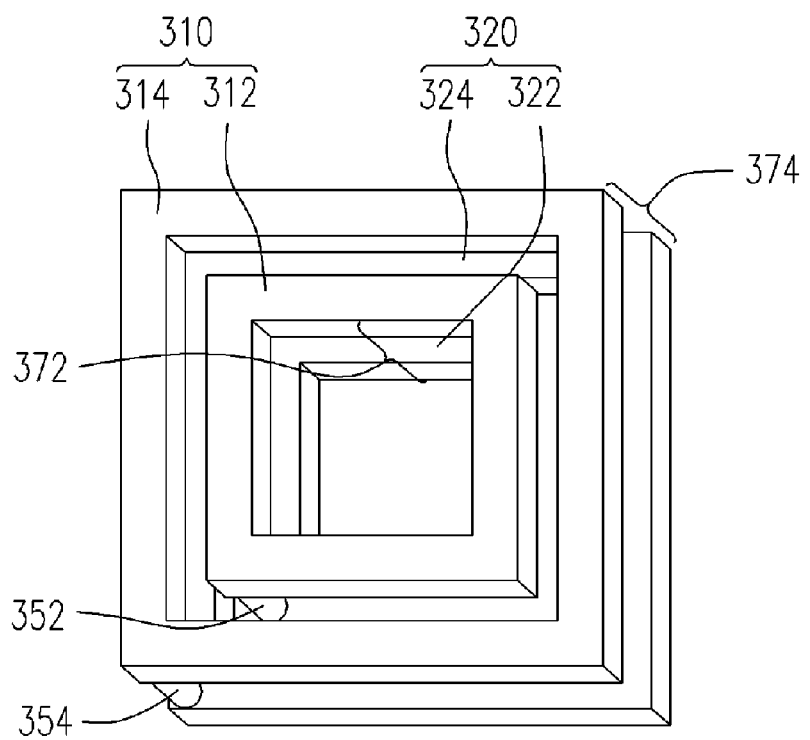
FIG. 3 is a three-dimensional view of a capacitor structure according to a second embodiment of the present invention.

FIG. 3 is a three-dimensional view of a capacitor structure according to a second embodiment of the present invention. For a clear demonstration of the capacitor structure, only a section of the substrate is shown in FIG. 3. As shown in FIG. 3, the capacitor structure 300 is configured in a substrate (not shown). The electrode sets 310 and 320 comprise ring-shaped first electrodes 312 and 322 and ring-shaped second electrodes 314 and 324 respectively. Furthermore, the second electrodes 314 and 324 surround the first electrodes 312 and 322 respectively. Through the first conductive plug 352 and the second conductive plug 354, the first electrodes 312 and 322 are coupled to the second electrodes 314 and 324 to form a first electrode structure 372 and a second electrode structure 374 respectively. The first electrode structure 372 and the second electrode structure 374 are coupled to each other through an electric field so that the desired capacitance is provided.

It should be noted that the first electrodes can take a circular shape, a linear shape, a polygon shape or other designs in other embodiments of the present invention. Beside a rectangular ring shape, the second electrodes can be a circular ring, a polygonal ring or some other designs. For a detailed description of these structures and associated disposition within the capacitor, please refer to the aforementioned embodiments. In the following, a detailed description will not be repeated.

Third Embodiment

Figure 4:
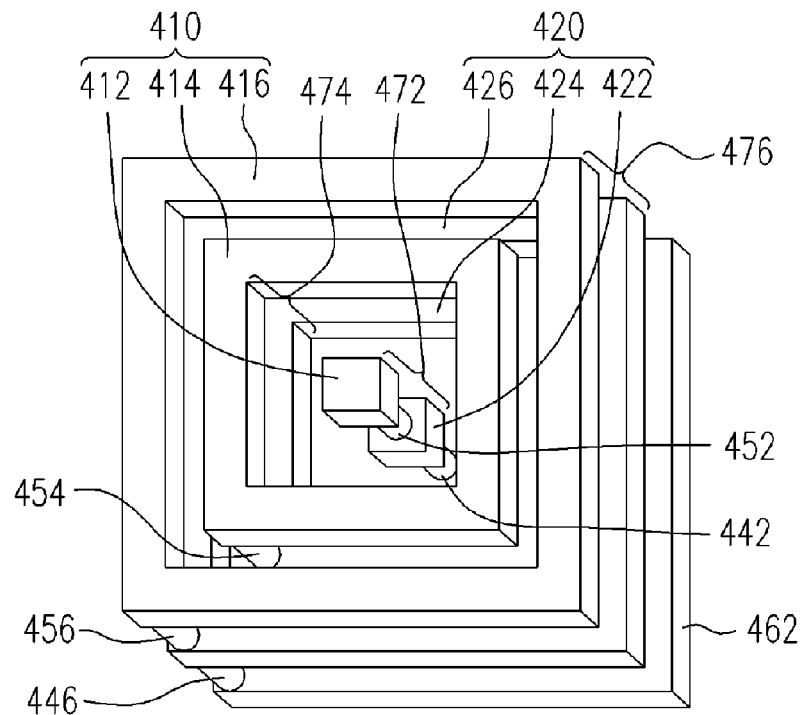
FIG. 4 is a three-dimensional view of a capacitor structure according to a third embodiment of the present invention.

FIG. 4 is a three-dimensional view of a capacitor structure according to a third embodiment of the present invention. As shown in FIG. 4, the electrode sets 410 and 420 of the capacitance structure 400 further comprise third electrodes 416 and 426 besides the first electrodes 412 and 422 and the second electrodes 414 and 424 surrounding the first electrodes 412 and 422. The third electrodes 416 and 426 surround the second electrodes 414 and 424 respectively.

The first electrodes 412 and 422 take a block shape and are connected to each other through a first conductive plug 452 to form a first electrode structure 472. The second electrodes 414 and 424 take a ring shape and are connected to each other through a second conductive plug 454 to form a second electrode structure 474. Furthermore, the third electrodes 416 and 426 take a ring shape and are connected to each other through a third conductive plug 456 to form a third electrode structure 476. In the present embodiment, the first electrode structure 472 and the third electrode structure 476 are coupled to an underlying power source layer 462 of the substrate through conductive plugs 442 and 446 respectively. The second electrode structure 444 is connected to an overlying power source layer (not shown) of the substrate, for example. Consequently, the first electrode structure 472 and the third electrode structure 476 can have an identical power level and be coupled with the second electrode structure 474 to form the desired electric field.

Obviously, in other embodiments of the present invention, the first electrode structure 472 and the third electrode structure 476 can be connected to different power sources so that each one is coupled to the second electrode structure 474 to form an electric field having different strength. In addition, besides an electrode set having three electrodes (a first electrode, a second electrode and a third electrode), the present invention allows the number of electrodes in each electrode set to increase progressively outward, according to the actual requirement. Hence, through different combinations of shapes, dispositions and coupling methods of the electrodes, various design requirements can be satisfied.

Fourth Embodiment

It should be noted that the present invention also provides a capacitor structure comprising a plurality of capacitor units connected in parallel, each based on one of the aforementioned capacitor structures.

Figure 5:
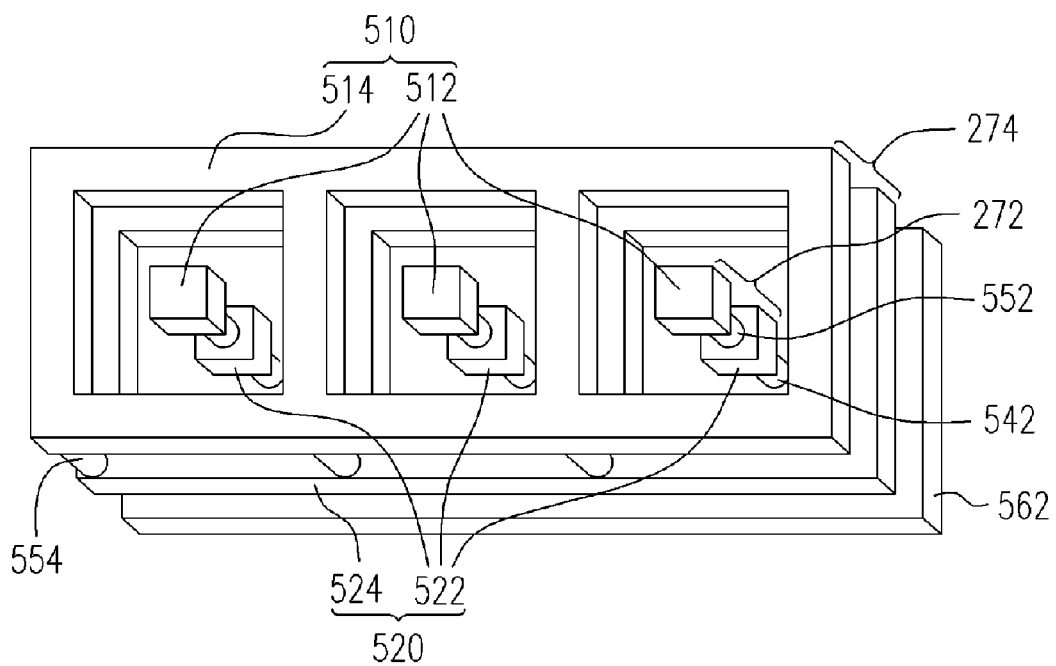
FIG. 5 is a three-dimensional view of a capacitor structure according to a fourth embodiment of the present invention.

FIG. 5 is a three-dimensional view of a capacitor structure according to a fourth embodiment of the present invention. The capacitor structure 500 in the present embodiment comprises a plurality of the capacitor structures 200 disclosed in the first embodiment. The second electrode structure 274 of adjacent capacitor structures 200 are disposed next to each other while the first electrode structure 272 of the adjacent capacitor structures 200 are disposed within the corresponding second electrode structures 274.

From another perspective, each electrode set 510/520 in the capacitor structure 500 in the present embodiment has a network-shaped second electrode 514/524 and a plurality of first electrodes 512/522 corresponding with the network of the second electrode 514/524. The corresponding first electrodes 512 and 522 are connected to each other through a first conductive plug 552 and are connected to an underlying power source layer 562 through another conductive plug 542. In addition, the second electrodes 514 and 524 are connected to each other through one or more second conductive plugs 554 (a plurality of second conductive plugs 554 are shown in FIG. 5) and are connected to an overlying or outwardly coplanar power source layer (not shown).

Fifth Embodiment

Besides the aforementioned multiple capacitor structures, the present invention also provides a capacitor structure having electrodes arranged in an array.

Figure 6:
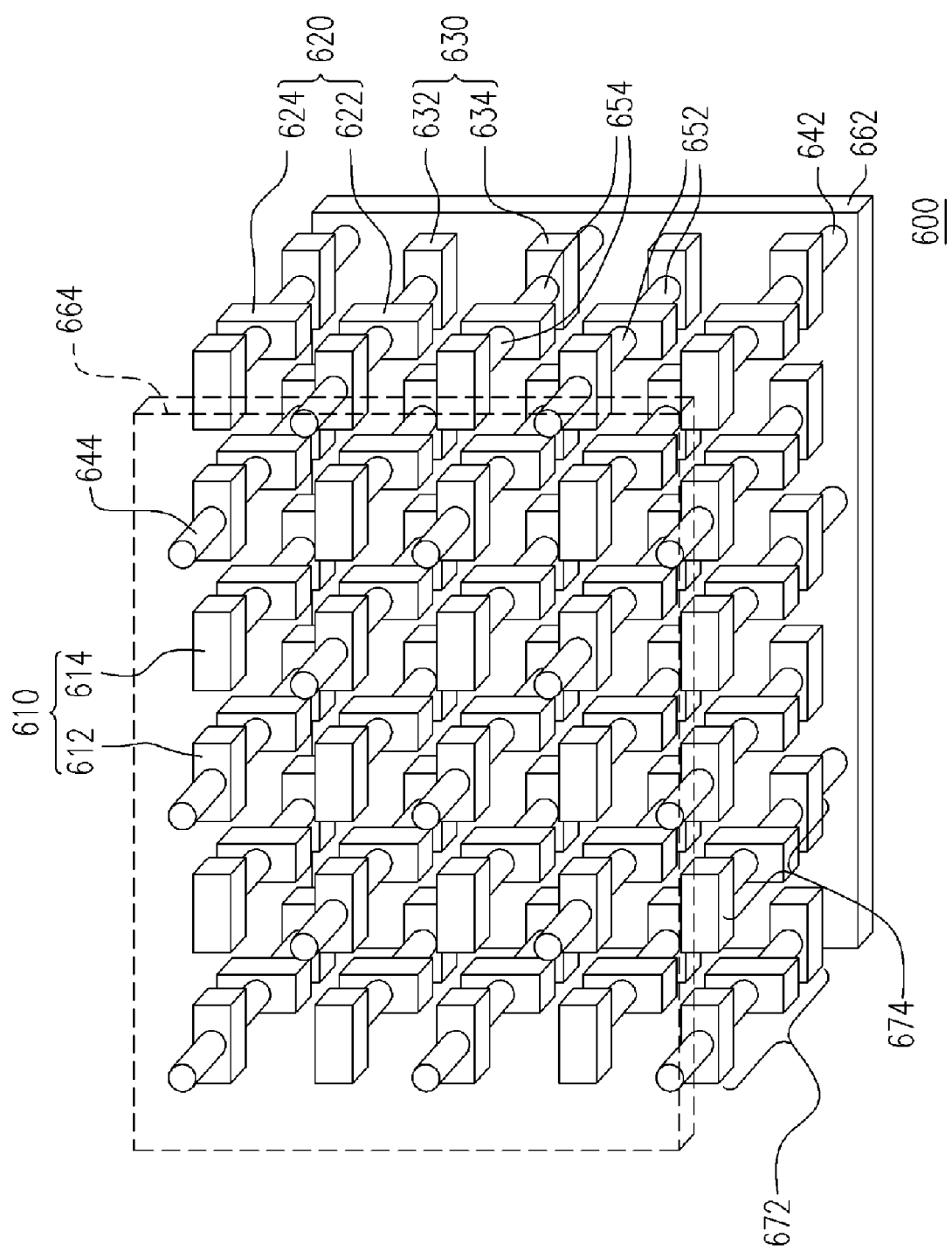
FIG. 6 is a three-dimensional view of a capacitor structure according to a fifth embodiment of the present invention.

FIG. 6 is a three-dimensional view of a capacitor structure according to a fifth embodiment of the present invention. For a clear demonstration of the capacitor structure, only a section of the substrate is shown in FIG. 6. As shown in FIG. 6, the capacitor structure 600 is configured in a substrate (not shown). The substrate is a semiconductor substrate, a circuit board or other types of circuit substrates, for example. The capacitor structure 600 comprises a first electrode set 610, a second electrode set 620, a third electrode set 630, a plurality of first conductive plugs 652 and a plurality of second conductive plugs 654. The first electrode set 610, the second electrode set 620 and the third electrode set 630 are located on different layers of the substrate (not shown), corresponding to each other, and are isolated from each other by dielectric layers (not shown).

As shown in FIG. 6, the electrode set 610 comprises a plurality of alternately disposed first electrodes 612 and second electrodes 614 to form a rectangular array. Similarly, the electrode set 620 comprises a plurality of alternately disposed first electrodes 622 and second electrodes 624 to form a rectangular array. Also, the electrode set 630 comprises a plurality of alternately disposed first electrodes 632 and second electrodes 634 to form a rectangular array. The first conductive plugs 652 are disposed between the electrode set 610, 620 and 630 (for example, within the aforementioned dielectric layers). Furthermore, the first electrodes 612, 622 and 632 correspond to each other and are connect to each other respectively through the first conductive plugs 652. In addition, the second conductive plugs 654 are also disposed among the electrode set 610, 620 and 630 (for example, within the aforementioned dielectric layer). Furthermore, the second electrodes 614, 624 and 634 correspond to each other and are connect to each other respectively through the second conductive plugs 654.

In the present embodiment, the first electrodes 612, 622 and 632 take a block shape and are connected to each other through the first conductive plugs 652 to form a plurality of pillar-shaped first electrode structures 672. Furthermore, each first electrode structure 672 is connected to an underlying power source layer 662 through a conductive plug 642. The second electrodes 614, 624 and 634 also take a block shape and are connected with each other through the second conductive plugs 654 to form a plurality of pillar-shaped second electrode structures 674. Furthermore, each second electrode structure 674 is connected to an overlying power source layer 664 through a conductive plug 644. In addition, the first electrode structure 672 and the second electrode structure 674 are alternately disposed to form a rectangular array. Through the first electrode structure 672 and the second electrode structure 674 of this rectangular array, an electric field is created to provide the desired capacitance.

Although a capacitor structure having two-layer electrode sets is shown in the aforementioned embodiments, the capacitor structure of the present invention includes the electrode sets having more than two layers connected and stacked on top of each other. Since the structure and disposition are similar to the aforementioned embodiments, a detailed description is not repeated.

In summary, the present invention utilizes a plurality of conductive plugs to connect electrodes in different layers within the substrate to form electrodes in three dimension. Through three-dimensional electrodes, the wiring space inside the substrate is reduced. Furthermore, various combinations of electrode designs and dispositions can be applied to fit different applications, such that circuit design can be more flexible. In addition, the first electrodes and the second electrodes inside each electrode set are located in the same layer of the substrate. Hence, circuit patterns can be aligned more accurately in the fabrication process, to provide better performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A capacitor structure configured in a substrate, the capacitor structure comprising:
   a plurality of electrode sets corresponding to each other and disposed on different layers in the substrate, wherein each electrode set further comprises:
   a first electrode;
   a second electrode disposed around the first electrode, wherein the second electrode encloses the first electrode and vertical projection of the second electrode is isolated to that of the first electrode of any other electrode sets;
   at least a first conductive plug disposed between two immediately adjacent electrode sets such that the first electrodes of the two immediately adjacent electrode sets correspond with each other and are connected through the first conductive plug; and
   at least a second conductive plug disposed between two immediately adjacent electrode sets such that the second electrodes of the two immediately adjacent electrode sets correspond with each other and are connected through the second conductive plug.

2. The capacitor structure of claim 1, wherein each first electrode takes a block shape.

3. The capacitor structure of claim 1, wherein each electrode set further comprises a third electrode such that the third electrode is disposed around the second electrode.

4. The capacitor structure of claim 3, wherein each third electrode takes a ring shape.

5. The capacitor structure of claim 1, wherein the substrate further comprises at least a dielectric layer disposed between two adjacent electrode sets and the first conductive plug and the second conductive plug are disposed in the dielectric layer.

* * * * *